United States Patent
Ouchi et al.

[11] Patent Number: 5,850,408
[45] Date of Patent: *Dec. 15, 1998

[54] METHOD OF DRIVING SEMICONDUCTOR LASER WITH WIDE MODULATION BAND, OPTICAL COMMUNICATION METHOD, SEMICONDUCTOR LASER DEVICE, NODE, AND OPTICAL COMMUNICATION SYSTEM

[75] Inventors: Toshihiko Ouchi, Machida; Masao Majima, Isehara, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 936,817

[22] Filed: Sep. 24, 1997

Related U.S. Application Data

[63] Continuation of Ser. No. 567,533, Dec. 5, 1995, abandoned.

[30] Foreign Application Priority Data

Dec. 5, 1994 [JP] Japan .................................. 6-300956

[51] Int. Cl.⁶ .............................. H01S 3/10; H01S 3/19
[52] U.S. Cl. .................................... 372/27; 372/45
[58] Field of Search .......................... 372/26, 27, 28, 372/45, 50, 29; 359/125

[56] References Cited

U.S. PATENT DOCUMENTS

| | | | |
|---|---|---|---|
| 4,918,701 | 4/1990 | Amann et al. | 372/27 X |
| 5,224,114 | 6/1993 | Ikeda et al. | 372/45 |
| 5,327,276 | 7/1994 | Shimosaka et al. | 359/125 |
| 5,345,462 | 9/1994 | Choquette | 372/45 |
| 5,383,211 | 1/1995 | Van De Walle et al. | 372/45 |
| 5,396,508 | 3/1995 | Bour et al. | 372/27 |
| 5,412,678 | 5/1995 | Treat et al. | 372/45 |
| 5,412,680 | 5/1995 | Swirhun et al. | 372/45 |
| 5,438,584 | 8/1995 | Paoli et al. | 372/45 |
| 5,448,548 | 9/1995 | Taneya et al. | 372/26 X |
| 5,497,390 | 3/1996 | Tanaka et al. | 372/27 |
| 5,590,145 | 12/1996 | Nitta | 372/27 |

FOREIGN PATENT DOCUMENTS

| | | |
|---|---|---|
| 0361035 | 4/1990 | European Pat. Off. . |
| 477987A3 | 4/1992 | European Pat. Off. . |
| 2-159781 | 6/1990 | Japan . |
| 7-162088 | 6/1995 | Japan . |

OTHER PUBLICATIONS

M. Suzuki, et al., "λ/4—Shifted DFB Laser/Electroabsorbtion Modulator Integrated Light Source", IEICE Technical Report, vol. 90, No. 8, Jun. 18, 1990, pp. 9–105.

M.J. Chauki, et al., "I.S. GBit/s FSK Transmission System Using Two Electrode DFB Laser As A Tunable FSK Discriminator/Photodetector", Electronics Letters, vol. 26, No. 15, Jul. 19, 1990, pp. 1146–1148.

Tadasu Ishikawa et al., "LiNb03 Optical Waveguide Modulator for Bi–directional transmission in Optical CATV subscriber systems", NHK Science and Technical Research Laboratories, pp. 51–58 (no date available).

Shouichi Ogita, et al. "Direct Frequency Modulation of Semiconductor Laser", Electronics & Communications in Japan, Part II—Electronics, vol. 74, No. 2, Feb. 1, 1991, pp. 39–48.

Hale W.B. et al., "Vector Modulation of Splint–Contact DFB Lasers", IEE Proceedings J. Optoelectronics, vol. 138, No. 2, Apr. 1991, pp. 109–112.

(List continued on next page.)

Primary Examiner—Rodney Bovernick
Assistant Examiner—Quyen Leung
Attorney, Agent, or Firm—Fitzpatrick, Cella, Harper & Scinto

[57] ABSTRACT

This invention discloses the following. Two modulation currents are injected into different electrodes of a semiconductor laser having a plurality of electrodes. The relationship between the phases of the two modulation currents is so adjusted that an output waveform is not distorted especially when a modulation frequency is low. Polarization modulation is applied as the modulation form.

83 Claims, 12 Drawing Sheets

OTHER PUBLICATIONS

Hidenao Tanaka et al. "Highly Efficient TE/TM Mode Switching of GaAsP/AlGaAs Strained Quantum–Well Laser Diodes", Applied Physics Letters, vol. 64, No. 2, Jan. 10, 1994, pp. 158–160.

Patent Abstracts of Japan, vol. 011, No. 376 (E–563), Jun. 27, 1987 JP–A–62 144426 (Matsushita Electric Ind. Co.).

A.I. Guriev et al., "Polarization Switching in GaAsP/InP DFB lasers with a strained active layer", Soviet Technical Physical Letters, vol. 19, No. 12, Dec. 12, 1993 pp. 741–743.

TE MODE
POWER [uW]

TM MODE
POWER [uW]

TE MODE

TM MODE

METHOD OF DRIVING SEMICONDUCTOR LASER WITH WIDE MODULATION BAND, OPTICAL COMMUNICATION METHOD, SEMICONDUCTOR LASER DEVICE, NODE, AND OPTICAL COMMUNICATION SYSTEM

This application is a continuation of application Ser. No. 08/567,533, filed Dec. 5, 1995, now abandoned.

BACKGROUND OF THE INVENTION

1. Field of the Invention

The present invention relates to a semiconductor laser and, more particular, to modulation of a semiconductor laser.

2. Related Background Art

Recently, a large transmission capacity is desired in the field of optical communications, and so optical frequency division multiplexing (optical FDM) transmission by which a plurality of wavelengths or optical frequencies are multiplexed into a single optical fiber has been developed.

The technologies of optical FDM can be roughly classified into two categories in accordance with the reception method: one is coherent optical communication which forms and detects an intermediate frequency by taking a beat with a station light source; the other is a method which transmits and detects only light having a desired wavelength (frequency) through a tunable filter.

As the tunable filter, a Mach-Zehnder filter, a fiber Fabry-Perot filter, an AO modulation filter, and a semiconductor filter have been developed.

It is important to decrease the wavelength interval in order to increase the transmission capacity as large as possible. For this purpose, it is desirable to decrease the transmission band width of the tunable filter and decrease the occupied frequency band or the spectral line width of a laser as a light source. For example, a semiconductor DFB filter with a tunable width of 3 nm has a transmission band width of approximately 0.03 nm, so it is ideally possible to multiplex 100 channels. However, in this case, the spectral line width of a light source is required to be 0.03 nm or smaller. At present, even a DFB laser known as a semiconductor laser which oscillates in a dynamic single mode gives rise to a dynamic wavelength variation when directly modulated by ASK. Since this results in an increased spectral line width of about 0.3 nm, a DFB laser is unsuitable for such wavelength multiplex transmission.

Examples of the methods which have been devised to suppress this wavelength variation are the use of an external intensity modulator (e.g., Suzuki et al.; "λ/4-Shift DFB Laser/Absorption Modulator Integrated Light Source", The Institute of Electronics, Information and Communication Engineers, Technical report of IEICE, OQE90-45, p. 99, 1990), a direct FSK modulation method (e.g., M. J. CHAWKI et al.; "1.5 Gbit/s FSK TRANSMISSION SYSTEM USING TWO ELECTRODE DFB LASER AS A TUNABLE FSK DISCRIMINATOR/PHOTODETECTOR", ELECTRON LET., Vol. 26, No. 15, p. 1146, 1990), and a direct polarization modulation method (Japanese Laid-Open Patent Application No. 2-159781).

Comparison of these three methods will be described below. A wavelength variation of the external modulator is approximately 0.03 nm, and this is the marginal performance meeting the specifications. However, the external modulator is unpreferable in respect of cost because the number of components is increased. In the FSK method a file on the receiver side is sometimes functioned as a wavelength discriminator, and this requires a complicated control technique.

The polarization modulation method uses a two-electrode laser as illustrated in FIG. 1. As shown in FIG. 2A, a bias current is fixed to a point at which TE and TM modes are switched, and $I_1$ is modulated with a weak rectangular current $\Delta I_1$. Consequently, the planes of polarization are switched as illustrated in FIG. 2B. A polarizer arranged at the output end of the laser as shown in FIG. 1 selects one of these polarization planes, thereby performing ASK. In this method, the number of components is not increased because only the number of electrodes of a conventional DFB laser is increased, and a wavelength variation is smaller than that in the external modulation method. Also, since a signal is transmitted by ASK, the method has an advantage in that the load on, e.g., a file on the receiver side is small.

As described above, the polarization modulation is a modulation method suitable for wavelength multiplex transmission and the like. Unfortunately, the conventional proposals do not contain much mention of the method of driving polarization modulation, so it is necessary to first establish the driving method to put this polarization modulation into practical use.

The polarization modulation method performs ASK modulation by applying a rectangular signal to one electrode of a multi-electrode DFB laser to thereby switch TE- and TM-polarized waves, and extracting one of these polarized waves by using a polarizer arranged at the exit end. It is unfortunate that the modulation characteristics deteriorate at low frequencies of 1 MHz or lower.

FIG. 3 shows the relationship between a modulation frequency and a modulation factor after this frequency transmits through the polarizer when the current $I_1$ of the two-electrode DFB laser in FIG. 1 is modulated with a sine-wave current. FIG. 4 shows the relationship between the modulation frequency and the phase difference (the phase difference between a modulation current and a modulation optical signal) under the same conditions. As shown in FIGS. 3 and 4, a dip of the modulation factor takes place near several hundred kHz, and the phase varies below 1 MHz and shows an opposite-phase response near DC. This is because, due to a physical factor of polarization modulation of a laser, polarization switching is done by the combined effect of a refractive index change resulting from opposite-phase heat having a cutoff at a few MHz and a refractive index change caused by an in-phase carrier density which is flat up to a resonance frequency. Since the effect of heat becomes dominant at low frequencies, the flatness of the phase characteristic is lost as described above.

The above characteristic gives rise to the following problem. The polarization modulation primarily transmits digital signals, and the pulse width is wavelength-converted below 1 MHz to result in a transmission error. Examples are shown in FIGS. 5A and 5B: a pulse narrowing occurs at a pulse width of 1 MHz in FIG. 5A, and an opposite-phase pulse is formed at 100 kHz in FIG. 5B. Accordingly, low frequencies are limited, and this limits the degree of freedom of coding.

SUMMARY OF THE INVENTION

The present invention has been made in consideration of the above situation, and has as its object to broaden the modulation band of polarization modulation particularly to low frequencies, improve the degree of freedom of coding, and reduce an error rate even with a long continuous code, thereby enabling transmission with a higher density.

To achieve this object the present invention, there is disclosed a semiconductor laser driving method of driving a semiconductor laser having two or more electrodes by switching two polarization modes with different planes of polarization, comprising the steps of:

injecting a main modulation current into one of the electrodes; and injecting a sub-modulation current whose phase is adjusted with respect to the main modulation current into at least one of the electrodes except for the electrode into which the main modulation current is injected. Preferred modes of this driving method are as follows.

The step of injecting the sub-modulation current is executed when a frequency of the switching is lower than a predetermined frequency.

The predetermined frequency is approximately 1 MHz.

The phase and/or a modulation amplitude of the sub-modulation current is so adjusted as to decrease a phase difference between the main modulation current and an output optical signal from the semiconductor laser.

The phase of the sub-modulation current is so adjusted as to be the same phase as or an opposite phase to a phase of the main modulation current.

Whether the phase of the sub-modulation current is to be the same phase as or an opposite phase to the phase of the main modulation current is determined in accordance with whether a sign of a slope of a boundary line, which is determined by an orthogonal coordinate system of the sub-modulation current and the main modulation current, and on which the two polarization modes of the semiconductor laser are switched, is positive or negative.

A ratio of modulation amplitudes of the sub-modulation current and the main modulation current is so adjusted that a slope of a boundary line, which is determined by an orthogonal coordinate system of the sub-modulation current and the main modulation current, and on which the two polarization modes of the semiconductor laser are switched, is substantially parallel to a synthetic amplitude of the sub-modulation current and the main modulation current on the orthogonal coordinate system.

Also, as an optical communication method using this driving method, the present invention discloses a method of performing optical communication by obtaining an intensity-modulated signal by selecting one polarization mode from the output from a semiconductor laser device driven by the above driving method, and further discloses an optical communication method of performing wavelength multiplexing.

The present invention discloses a semiconductor laser device for outputting two polarization modes with different planes of polarization by switching the two polarization modes, comprising:

a semiconductor laser having two or more electrodes;

means for injecting a main modulation current into one of the electrodes of the semiconductor laser; and means for injecting a sub-modulation current whose phase is adjusted with respect to the main modulation current into at least one of the electrodes except for the electrode into which the main modulation current is injected. Preferred modes of this semiconductor laser device are as follows.

The sub-modulation current is injected when a frequency of the switching is lower than a predetermined frequency.

The predetermined frequency is approximately 1 MHz.

The device further comprises:

a modulation power supply; and means for supplying an output from the modulation power supply to the means for injecting the main modulation current and the means for injecting the sub-modulation current.

The means for injecting the sub-modulation current has a frequency characteristic and does not inject the sub-modulation current if a frequency of the output from the modulation power supply exceeds a predetermined frequency.

The predetermined frequency is approximately 1 MHz.

The semiconductor laser is a distributed feedback laser including a diffraction grating near an optical waveguide containing a light-emitting layer, so that the light-emitting layer contains a quantum well structure, and a wavelength corresponding to an energy band gap between an energy level of a light hole and a ground level of an electron in a quantum well of the quantum well structure is close to a Bragg wavelength of the diffraction grating.

Threshold gains at the Bragg wavelength in the two polarization modes are substantially equal.

The quantum well structure is a strained quantum well structure into which a strain is introduced, so that in a quantum well an energy level of a light hole and an energy level of a heavy hole are equal or the energy level of a light hole is closer to a ground level of an electron.

The strain is a tensile strain introduced into an internal quantum well of the quantum well structure.

The quantum well structure is a multiple quantum well structure.

As a more practical mode of the semiconductor laser device, the present invention discloses a semiconductor laser device for outputting two polarization modes with different planes of polarization by switching the polarization modes, comprising:

a semiconductor laser having two or more electrodes;

a modulation power supply;

first injecting means for passing an output from the modulation power supply through a first amplifier and injecting the output as a first modulation current into one of the electrodes of the semiconductor laser; and second injecting means for passing the output from the modulation power supply through a second amplifier and injecting the output as a second modulation current into at least one of the electrodes except for the electrode into which the first injecting means injects the first modulation current, wherein a cutoff frequency of the second amplifier is a predetermined frequency, and the second modulation current is not injected if a frequency of the output from the modulation power supply exceeds the predetermined frequency. More detailed modes of this semiconductor laser device are as follows.

The outputs from the first and second amplifiers have the same phase.

The outputs from the first and second amplifiers have opposite phases.

The predetermined frequency is approximately 1 MHz.

A ratio of gains of the first and second amplifiers is so adjusted as to decrease a difference between a phase of the main modulation current and a phase of an output optical signal from the semiconductor laser.

As a similarly practical mode of the semiconductor laser device, the present invention discloses a semiconductor laser for outputting two polarization modes with different planes of polarization by switching the polarization modes, comprising:

a semiconductor laser having two or more electrodes;

a modulation power supply;

first injecting means for passing an output from the modulation power supply through a first voltage-current converter, DC-coupling an output from the first voltage-current converter and a first DC current, and injecting the resultant current as a first modulation current into one of the electrodes of the semiconductor laser; and second injecting means for passing the output from the modulation power supply through a second voltage-current converter, DC-coupling an output from the second voltage-current converter and a second DC current, and injecting the resultant current as a second modulation current into at least one of the electrodes except for the electrode into which the first injecting means injects the first modulation current, wherein the second injecting means has a low-pass filter with a predetermined cutoff frequency for filtering the output from the second voltage-current converter, and the second modulation current is not injected if a frequency of the output from the modulation power supply exceeds the predetermined frequency. More detailed modes of this semiconductor device are as follows.

The first and second voltage-current converters DC-couple the output from the modulation power supply at the same phase.

The first and second voltage-current converters DC-couple the output from the modulation power supply at opposite phases.

The predetermined frequency is approximately 1 MHz.

A ratio of gains of the first and second voltage-current converters is so adjusted as to decrease a difference between a phase of the main modulation current and a phase of an output optical signal from the semiconductor laser.

Also, as a node using the above semiconductor laser device, the present invention discloses a node having polarization mode selecting means for selectively outputting one of the two polarization modes from the output from the semiconductor laser device.

Furthermore, the present invention discloses an optical communication system using the above node as a node for transmitting information.

As described above, in the present invention, two modulation currents are injected into different electrodes of a multi-electrode semiconductor laser (when the modulation frequency of polarization modulation is low).

The relationship between the phases of these two modulation currents slightly change in accordance with the polarization switching characteristics of the device. Generally, in the case of a semiconductor laser with a structure which is largely influenced by heat, the distributions of TE and TM oscillation modes with respect to $I_1/I_2$ are as shown in FIG. 17; the slope of the boundary line between the TE and TM oscillation modes is positive. That is, when a DC bias is fixed near the switching point of polarization, polarization switching from TE to TM occurs if $I_1$ is increased, and polarization switching from TM to TE occurs if $I_2$ is increased. Accordingly, the phase of one polarization switching is opposite to the phase of the other with respect to the changes in $I_1$ and $I_2$. Therefore, when a modulation current in phase with $\Delta I_1$ is applied as $\Delta I_2$, the direction of thermal polarization switching becomes opposite to that of $\Delta I_1$, and this suppresses the thermal polarization switching with respect to $\Delta I_1$. The amplitude ratio of $\Delta I_1$ to $\Delta I_2$ at this time is preferably the one illustrated in FIG. 17, which is parallel to the switching line of polarization.

Although various methods are possible as the means for generating this in-phase signal, it is only necessary to take account of low frequencies from DC to a few MHz. For example, as illustrated in FIG. 9, a signal is divided into two signal components by a power divider, one signal component is passed through a wide-band inverting amplifier, and the other is passed through an inverting amplifier with a cutoff frequency of about a few MHz. These signals are then passed through biases T each consisting of L and C and superposed on the electrodes of a laser by a DC current and AC coupling. Referring to FIG. 9, the laser is expressed as two parallel diodes.

Alternatively, high-speed current driver chips are used as illustrated in FIG. 10. In this configuration, two signals are used to drive the respective electrodes in such a manner that one signal is directly used and the other is passed through a low-pass filter with a cutoff frequency of a few MHz. As in FIG. 10, each driver chip is a parallel integrated circuit of a modulation current source Ip and a DC bias current source Ib. In this arrangement, no low-frequency cutoff of a modulation current exists since there is no bias T, so it is possible to drive up to DC. Furthermore, the circuit can be mounted on a small circuit board and can also be modularized into a single box together with a laser.

On the other hand, the effect of heat is sometimes small depending on the structure of a semiconductor laser. A device of this sort exhibits a polarization switching characteristic shown in FIG. 18 which is contrary to that shown in FIG. 17; that is, the slope of the boundary line between TE and TM oscillation modes is negative. If this is the case, in contrast to the case described previously, opposite-phase signals are used as $\Delta I_1$ and $\Delta I_2$.

DETAILED DESCRIPTION OF THE PREFERRED EMBODIMENTS (First Embodiment)

Figure 1:
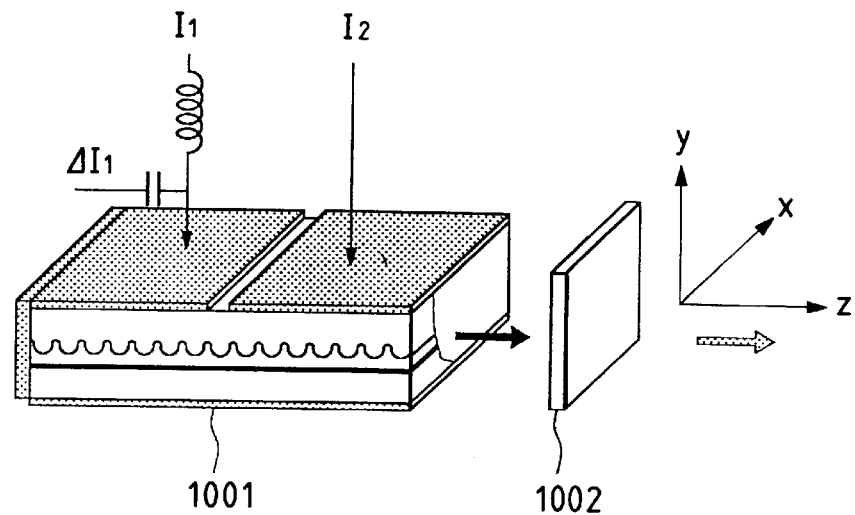
FIG. 1 is a perspective view for explaining the principle of polarization modulation of a conventional example.
Figure 6:
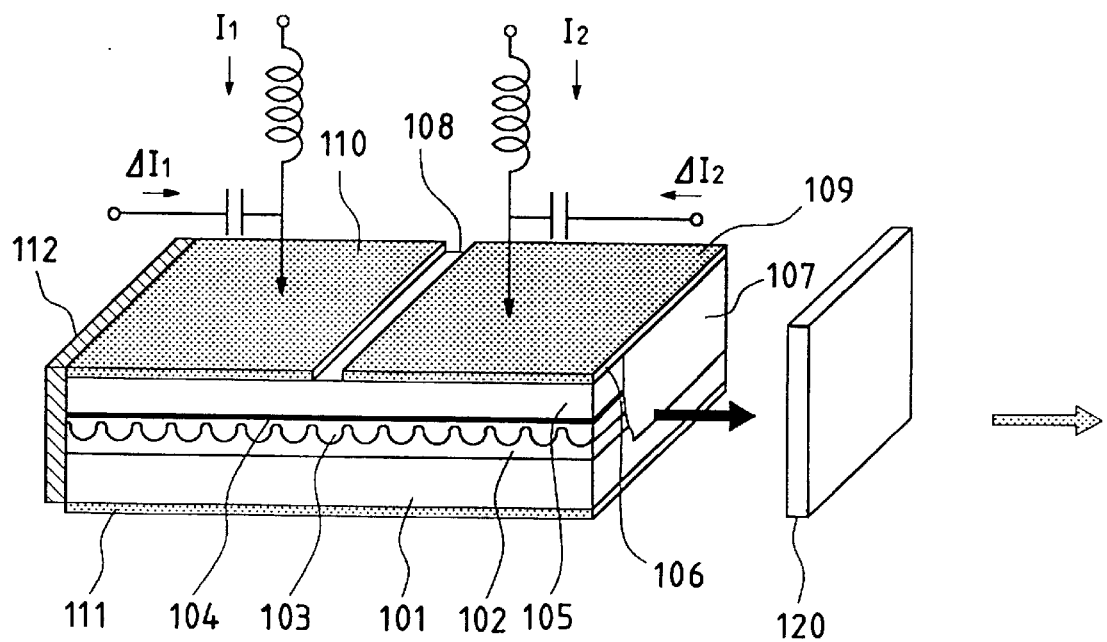
FIG. 6 is a perspective view showing a semiconductor laser used in the first to third embodiments and a portion of a driving current injecting means used in these embodiments.
Figure 2A:
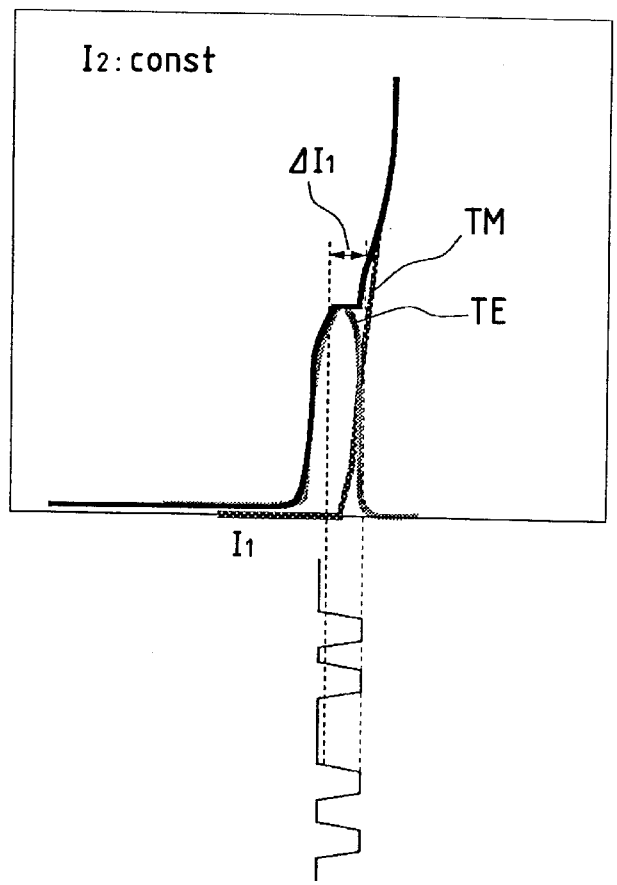
FIGS. 2A and 2B are graphs for explaining the principle of polarization modulation of the conventional example.
Figure 2B:
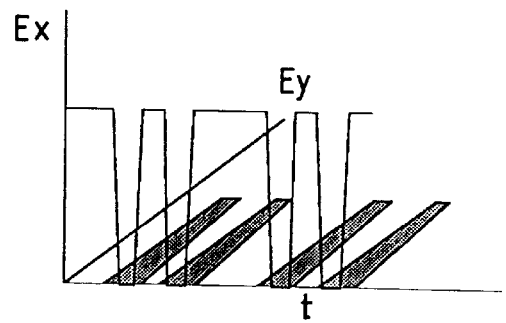
Figure 9:
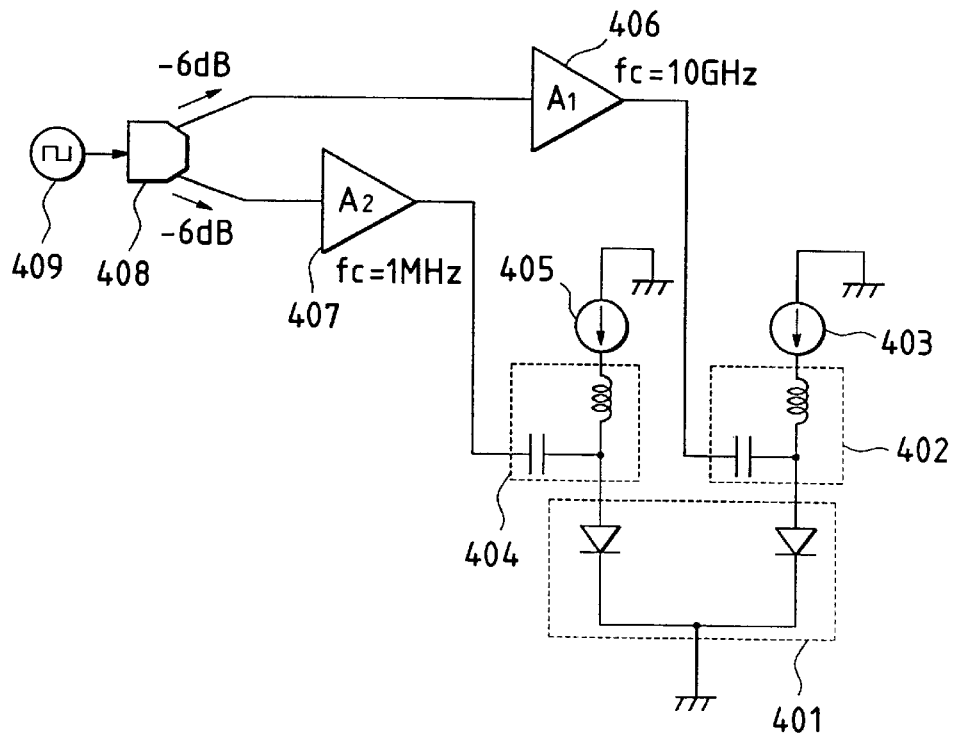
FIG. 9 is a circuit diagram showing the configuration of a semiconductor laser driver in the first and third embodiments.

FIG. 6 is a perspective view of a two-electrode DFB laser for realizing the driving method of the present invention. FIG. 9 is a circuit diagram for explaining the configuration of a driver of this embodiment.

Referring to FIG. 6, this two-electrode DFB laser includes an n-InP substrate 101, an n-InP buffer layer 102 in which a diffraction grating 0.05 $\mu$m in depth is formed, a 0.2-$\mu$m thick n-InGaAsP (band-gap wavelength $\lambda g=1.17$ $\mu$m) lower optical guide layer 103, an active layer 104 with a strained superlattice structure consisting of five 10-nm thick i-$In_{0.29}Ga_{0.71}As$ well layers and five 10-nm thick i-InGaAsP ($\lambda g=1.17$ $\mu$m) layers, a p-InP cladding layer 105, a p-$In_{0.53}Ga_{0.47}As$ contact layer 106, a high-resistance InP buried layer 107, an electrode isolation region 108 from which the contact layer 106 is removed, a Cr/AuZnNi/Au layer 109 as an electrode, a Cr/AuZnNi/Au layer 110 as an electrode, an AuGeNi/Au layer 111 as a substrate electrode, and an SiO film 112 as an antireflection film. In this DFB laser, the active layer serves as a multiple quantum well layer with a tensile strain, and the transition energy between the light-hole level and the electron ground level and the transition energy between the heavy-hole level and the electron ground level are so designed as to be equal. Consequently, the oscillation threshold value in TM polarization is lower than that in conventional DFB lasers. This makes an efficient polarization switching feasible. A laser having a similar arrangement is disclosed in Japanese Patent Application No. 5-310592. In order for the distributed feedback wavelength by the diffraction grating 103 to be close to the wavelength corresponding to the band gap between the light-hole level and the electron ground level, the pitch of the diffraction grating is set at 240 nm so that the diffraction grating has a Bragg wavelength at 1.562 $\mu$m in a TE mode and at 1.558 $\mu$m in a TM mode.

Figure 3:
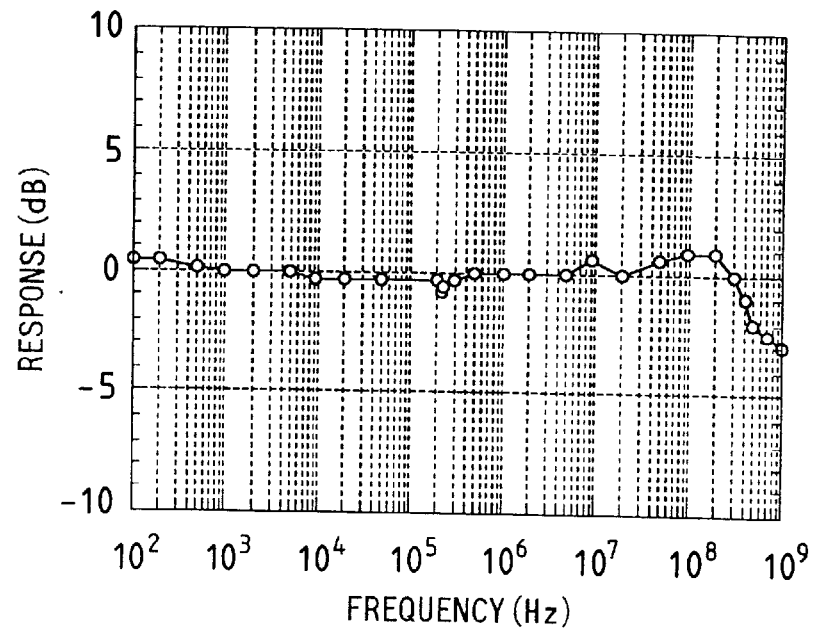
FIG. 3 is a graph showing the polarization modulation characteristic of the conventional example.
Figure 4:
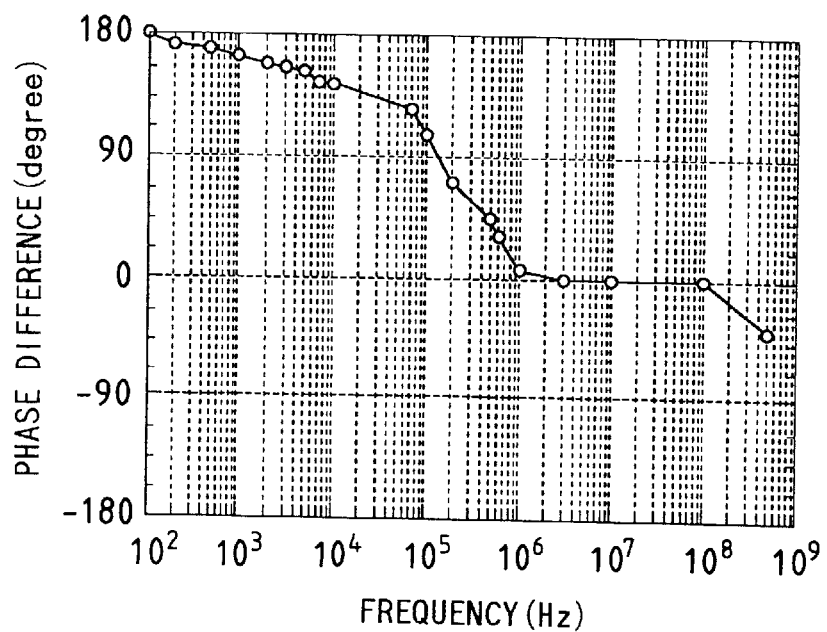
FIG. 4 is a graph showing the phase characteristic of the conventional example.
Figure 5A:
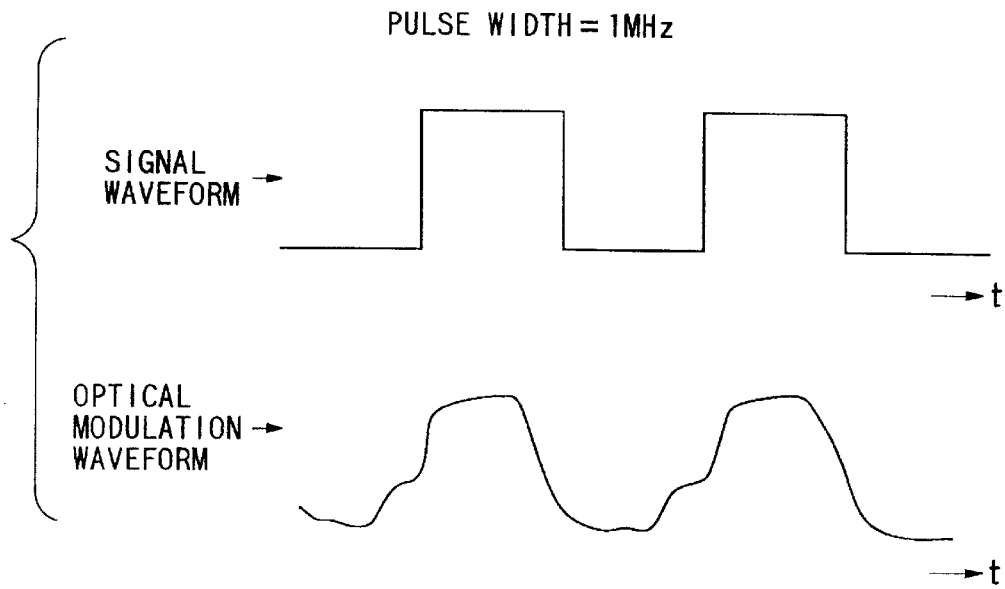
FIGS. 5A and 5B are timing charts showing the response waveforms of polarization modulation of the conventional example.
Figure 5B:
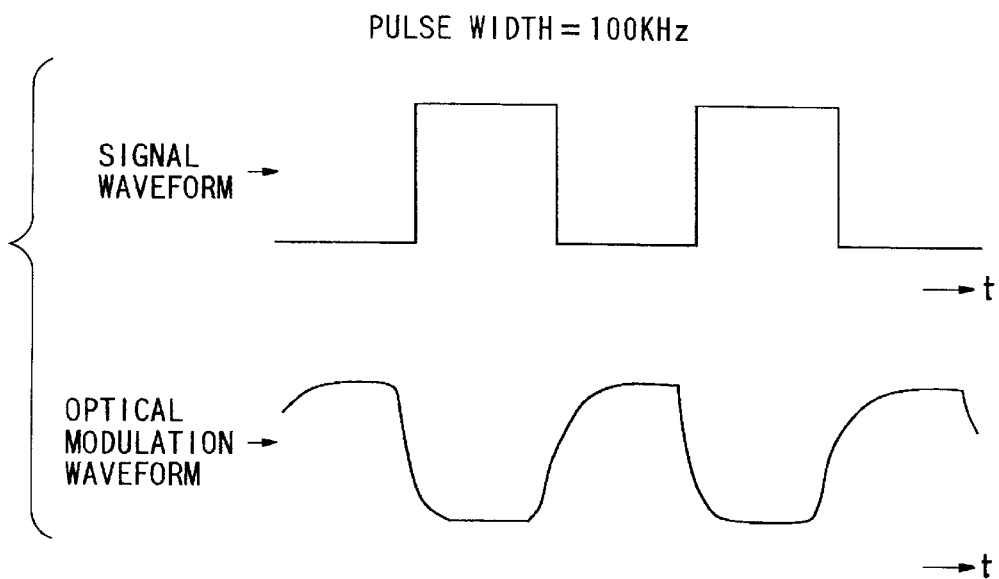

In this configuration, switching between TE and TM occurs as described previously when DC biases of 35 mA and 28 mA are flowed through the electrodes 109 and 110, respectively, and a digital signal $\Delta I_1$ with an amplitude of 5 mA is superposed on the electrode 110. Also, when a sine-wave signal $\Delta I_1$ with an amplitude of 5 mA is superposed, the resultant modulation frequency dependences are as shown in FIGS. 3 and 4; although the modulation factor is within 3 dB at 100 Hz to 1 GHz, the phase difference rotates below 1 MHz. This is because the thermal effect is greatly dominant at low frequencies as described earlier in "SUMMARY OF THE INVENTION".

By using the device configuration as illustrated in FIG. 9, therefore, a modulation current $\Delta I_2$ as a sub-current with respect to the main modulation current $\Delta I_1$ is flowed through the electrode 109. More specifically, a signal from a modulation current 409 is divided into two signal components by a 1:1 power divider 408. One signal component is passed through a wide-band inverting video amplifier 406 with a gain of 10 and a cutoff frequency fc of 10 GHz, superposed on a DC current from a DC power supply 403 by a bias T 402 with a low cutoff frequency of 1 kHz, and driven as a driving current $I_1+\Delta I_1$ for a laser 401. The other output from the power divider is passed through an inverting operational amplifier 407 with a gain of 10 and a cutoff frequency fc of 1 MHz, superposed on a DC current from a DC power supply 405 by a bias T 404, and driven as a driving current $I_2+\Delta I_2$ for the laser 401. In this configuration, the currents $\Delta I_1$ and $\Delta I_2$ are in phase with each other because both the amplifiers 406 and 407 are of an inverting output type. Also, the modulation power supply is of a variable output type, and the modulation factor is adjusted by the power supply. The gain ratio of the amplifiers 406 and 407 is so optimized as to suppress the thermal effect at low frequencies and is determined in accordance with the TE/TM oscillation characteristics (to be described later) of this device and because the division ratio of the power divider is 1:1. This current ratio needs to be optimized for each individual device, since it changes in accordance with the composition, the structure, the material, and the mounting form of the device. Although the cutoff frequency of the amplifier 406 is set at 10 GHz in this embodiment, this cutoff frequency can be arbitrarily chosen in accordance with the modulation frequency.

Figure 19A:
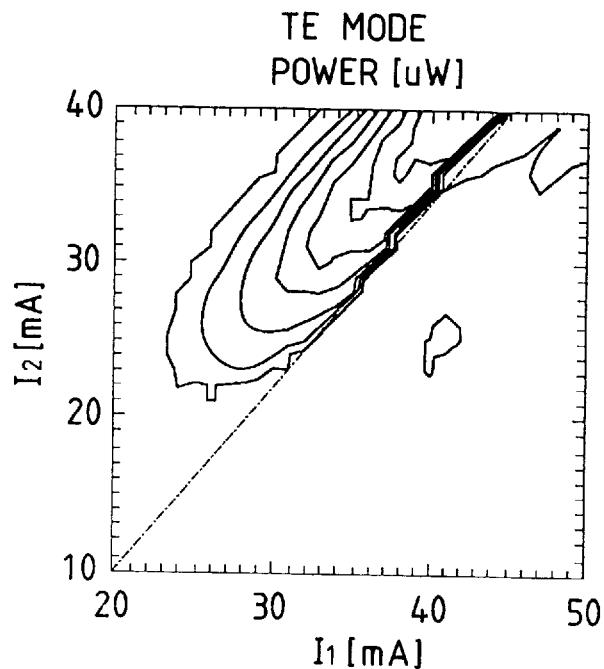
FIGS. 19A and 19B are graphs showing the oscillation mode distributions of TE and TM modes, respectively, of the semiconductor laser in the first embodiment.
Figure 19B:
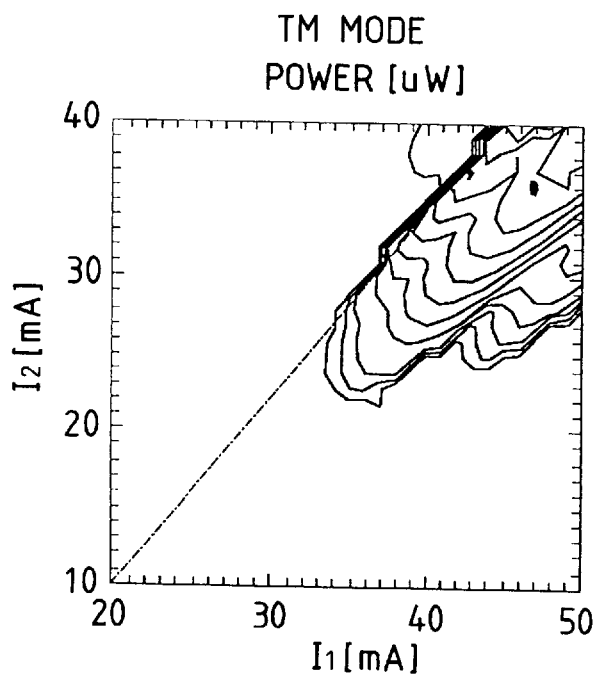

The distributions of TE and TM oscillation modes of this device are as illustrated in FIGS. 19A and 19B, respectively, with respect to $I_1/I_2$. That is, when a DC bias is fixed near the switching point of polarization, polarization switching from TE to TM occurs if $I_1$ is increased, and polarization switching from TM to TE occurs if $I_2$ is increased. Accordingly, the phase of one polarization switching is opposite to the phase of the other with respect to the changes in $I_1$ and $I_2$. Therefore, when a modulation current in phase with $\Delta I_1$ is applied as $\Delta I_2$, the direction of thermal polarization switching becomes opposite to that of $\Delta I_1$, and this suppresses the thermal polarization switching with respect to $\Delta I_1$. The amplitudes of $\Delta I_1$ and $\Delta I_2$, i.e., in this embodiment, the gains of the amplifiers 406 and 407, are equal so that the synthetic slope of $\Delta I_1$ and $\Delta I_2$ is 1, since the slope of the boundary line between the TE and TM oscillation modes is 1 in FIGS. 19A and 19B.

Figure 7:
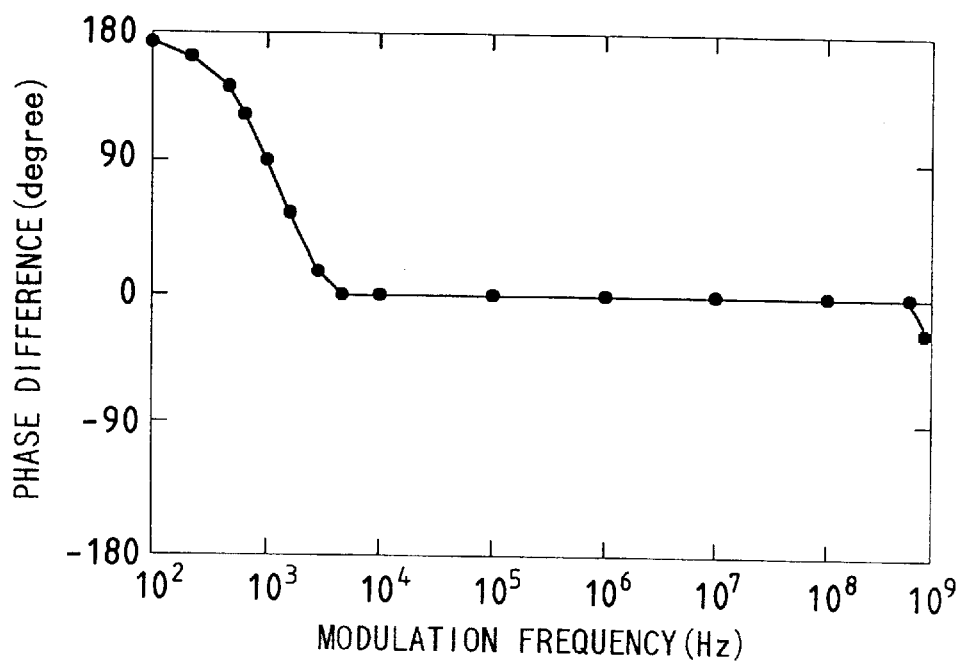
FIG. 7 is a graph showing the phase characteristic when polarization modulation is performed in the first and third embodiments.

When polarization modulation was performed by this driving method, a phase characteristic which was flat down to low frequencies, i.e., a few kHz, was obtained as shown in FIG. 7, i.e., the low-frequency characteristic was greatly improved. This enabled polarization modulation using a rectangular-wave signal with a pulse width of a few kHz to a few GHz, i.e., made ASK transmission possible.

(Second Embodiment)

Figure 10:
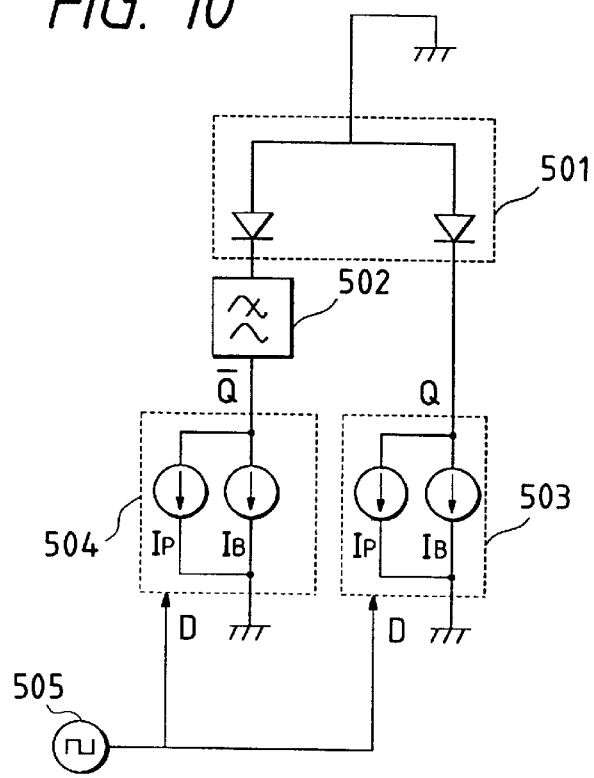
FIG. 10 is a circuit diagram showing the configuration of a semiconductor laser driver in the second embodiment.

FIG. 10 is a circuit diagram for explaining the second embodiment of the present invention. In FIG. 10, the configuration of a driver different from that in the first embodiment is illustrated. A device used is a two-electrode DFB laser which is nearly identical with that used in the first embodiment.

In this embodiment, a bias T having a low-frequency cutoff is not used, and modulable laser driver ICs 503 and 504 are used to decrease the overall dimensions of the driving system. As indicated by reference numerals 503 and 504 in FIG. 10, each driver IC is a parallel integrated circuit of a DC current source Ib and a modulation current source Ip. Upon receiving a modulating signal of an ECL level (which is a voltage pulse with an amplitude of −0.9 V to −1.8 V and is an input signal for driving Emitter Coupled Logic (ECL) as a high-speed driver IC), this driver IC can drive a modulation current having a DC offset current. The IC can control the modulation factor and the bias current quantity.

A practical driving method will be described below. An output from a modulation power supply 505 having an ECL output is input to the driver ICs 503 and 504. If the modulation power supply voltage is to be divided into two components, this is performed immediately before the two drivers. This obviates the need for a power divider. The driver ICs 503 and 504 extract in-phase outputs from the modulation input. One output is passed through a low-pass filter with a cutoff of 1 MHz and driven as a driving current $I_2+\Delta I_2$ for a laser 501. The other is directly driven as a driving current $I_1+\Delta I_1$ for the laser 501. The amplitude ratio of the modulation currents is optimized to 1:1 as in the first embodiment. As shown in FIG. 10, it is desirable that each driver IC extract a current with the laser suspended from the ground since this makes a high-speed operation possible. In this embodiment, therefore, the conductivity types of the device components are reversed, i.e., the device has a p-type substrate and an n-type electrode on the electrode isolation side.

Figure 8:
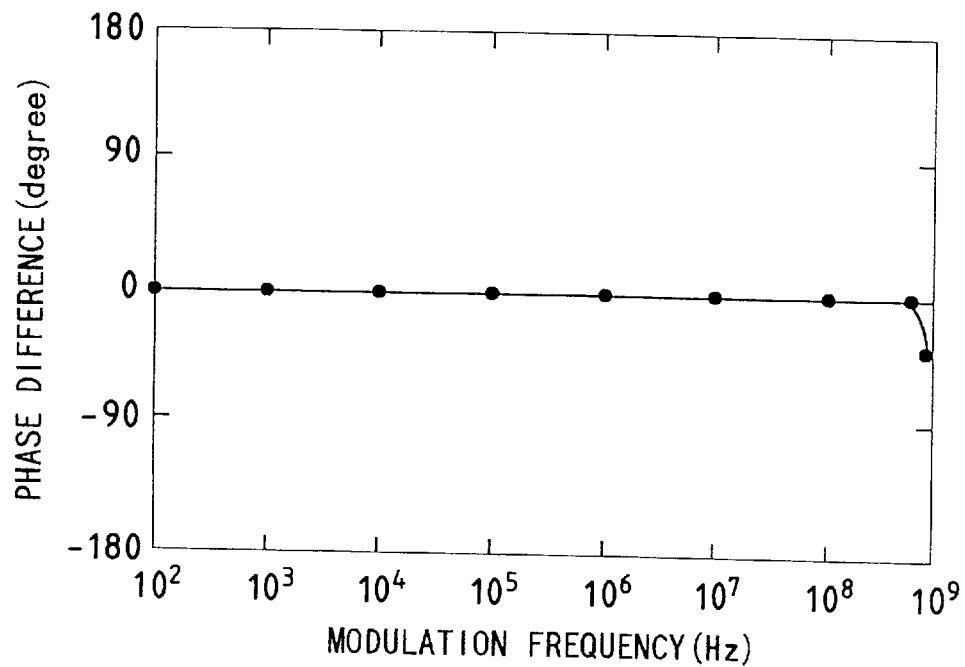
FIG. 8 is a graph showing the phase characteristic when polarization modulation is performed in the second embodiment.

With this driving system, the overall system can be greatly miniaturized and modularized into a single box. Also, in the first embodiment, the low frequency is limited in the band of the bias T, whereas in this embodiment, there is no limit on low frequencies. This can further improve the low-frequency characteristics. That is, as illustrated in FIG. 8, it was possible to flatten the phase characteristic over a broad range from 100 Hz to 1 GHz. In ASK transmission, this permits coding using an NRZ signal having a degree of continuation of $2^{20}-1$ or more at several Gbps, making very-high-density transmission possible.

(Third Embodiment)

This embodiment uses a device having a structure nearly identical with the structures of the semiconductor lasers used in the first and second embodiments and having a different composition from the compositions of these semiconductor lasers.

Since the structure of the device is almost the same as those in the first and second embodiments, the composition of the device will be described below with reference to FIG. 6. Referring to FIG. 6, this device includes an n-InP substrate 101, an n-InP buffer layer 102 in which a diffraction grating 0.05 μm in depth is formed, a 0.2-μm thick n-InGaAsP (band-gap wavelength λg=1.3 μm) lower optical guide layer 103, an active layer 104 with a strained superlattice structure consisting of five 8-nm thick i-$In_{0.4}Ga_{0.6}As$ well layers and five 10-nm thick i-InGaAsP (λg=1.3 μm) barrier layers, a p-InP cladding layer 105, a p-$In_{0.53}Ga_{0.47}As$ contact layer 106, a high-resistance InP buried layer 107, an electrode isolation region 108 from which the contact layer 106 is removed, a Cr/AuZnNi/Au layer 109 as an electrode, a Cr/AuZnNi/Au layer 110 as an electrode, an AuGeNi/Au layer 111 as a substrate electrode, and an SiO film 112 as an antireflection film. In this DFB laser, the active layer serves as a multiple quantum well layer with a tensile strain. In order for the distributed feedback wavelength by the diffraction grating 103 to be close to the wavelength corresponding to the band gap between the light hole level and the electron ground level, the pitch of the diffraction grating is set at 240 nm so that the diffraction grating has a Bragg wavelength at 1.562 μm in a TE mode and at 1.558 μm in a TM mode.

In this configuration, switching between TE and TM occurs as described previously when DC biases of 35 mA and 21 mA are flowed through the electrodes 109 and 110, respectively, and a digital signal $\Delta I_1$ with an amplitude of 5 mA is superposed on the electrode 110. Also, when a sine-wave signal $\Delta I_1$ with an amplitude of 5 mA is superposed, the resultant modulation frequency dependences are as shown in FIGS. 3 and 4; although the modulation factor is within 3 dB at 100 Hz to 1 GHz, the phase difference rotates below 1 MHz. This is because the thermal effect is greatly dominant at low frequencies as described earlier in "SUMMARY OF THE INVENTION".

As in the first embodiment, therefore, by using the method as illustrated in FIG. 9, a modulation current $\Delta I_2$ as a sub-current is flowed through the electrode 109. However, in this embodiment an amplifier 406 is of an inverting type and an amplifier 407 is of a non-inverting type. More specifically, a signal from a modulation current 409 is divided into two signal components by a 1:1 power divider 408. One signal component is passed through the wide-band inverting video amplifier 406 with a gain of 30 and a cutoff frequency of 10 GHz, superposed on a DC current from a DC power supply 403 by a bias T 402 with a low cutoff frequency of 1 kHz, and driven as a driving current $I_1+\Delta I_1$ for a laser 401. The other output from the power divider is passed through the non-inverting operational amplifier 407 with a gain of 20 and a cutoff frequency of 1 MHz, superposed on a DC current from a DC power supply 405 by a bias T 404, and driven as a driving current $I_2+\Delta I_2$ for the laser 401. In this configuration, the modulation power supply is of a variable output type, and the modulation factor is adjusted by the power supply. The gain ratio of the amplifiers 406 and 407 is so optimized as to suppress the thermal effect at low frequencies and is thus determined because the amplitude ratio of the main modulation current $\Delta I_1$ to the sub-modulation current $\Delta I_2$ is to be 3:2. This current ratio needs to be optimized for each individual device, since it changes in accordance with the composition, the structure, the material, and the mounting form of the device.

Figure 20A:
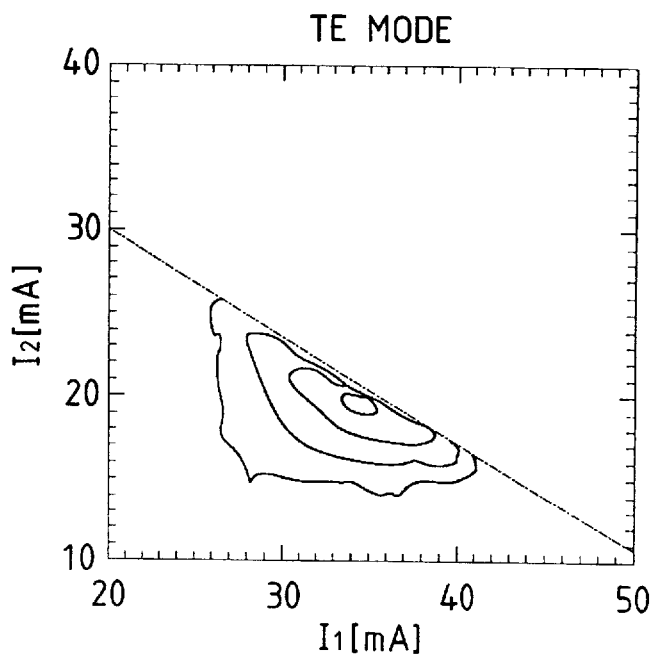
FIGS. 20A and 20B are graphs showing the oscillation mode distributions of TE and TM modes, respectively, of the semiconductor laser in the third embodiment.
Figure 20B:
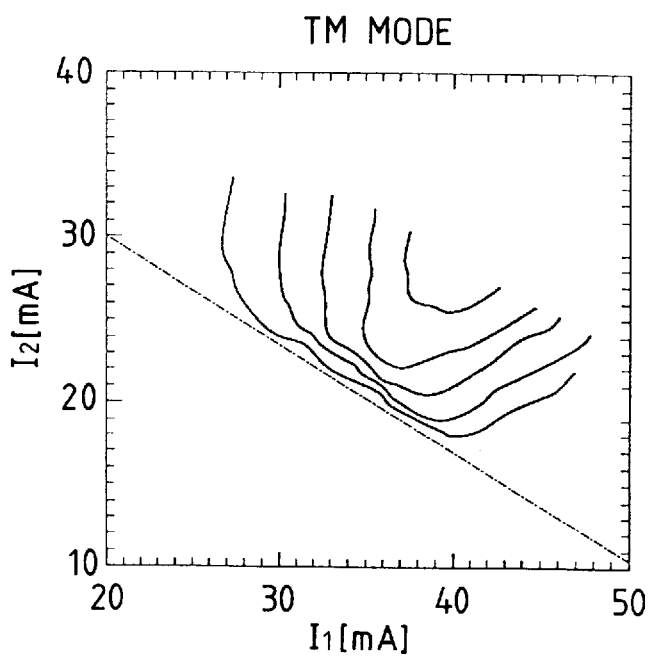

The distributions of TE and TM oscillation modes of this device are as illustrated in FIGS. 20A and 20B, respectively, with respect to $I_1/I_2$. That is, when a DC bias is fixed near the switching point of polarization, polarization switching from TE to TM occurs if $I_1$ is increased, and polarization switching from TM to TE occurs if $I_2$ is increased. Accordingly, one polarization switching is in phase with the other with respect to the changes in $I_1$ and $I_2$. Therefore, when a modulation current having an opposite phase to that of $\Delta I_1$ is applied as $\Delta I_2$, the direction of thermal polarization switching becomes opposite to that of $\Delta I_1$, and this suppresses the thermal polarization switching with respect to $\Delta I_1$. Since the slope of the boundary line between the TE and TM oscillation modes is $-\frac{2}{3}$, $\Delta I_1/\Delta I_2=-\frac{2}{3}$.

When polarization modulation is performed by this driving method, a phase characteristic which is flat down to low frequencies, i.e., a few kHz, is obtained as in the first embodiment, i.e., the low-frequency characteristic is greatly improved. This enables polarization modulation using a rectangular-wave signal with a pulse width of a few kHz to a few GHz, i.e., makes ASK transmission possible.

(Fourth Embodiment)

Figure 11:
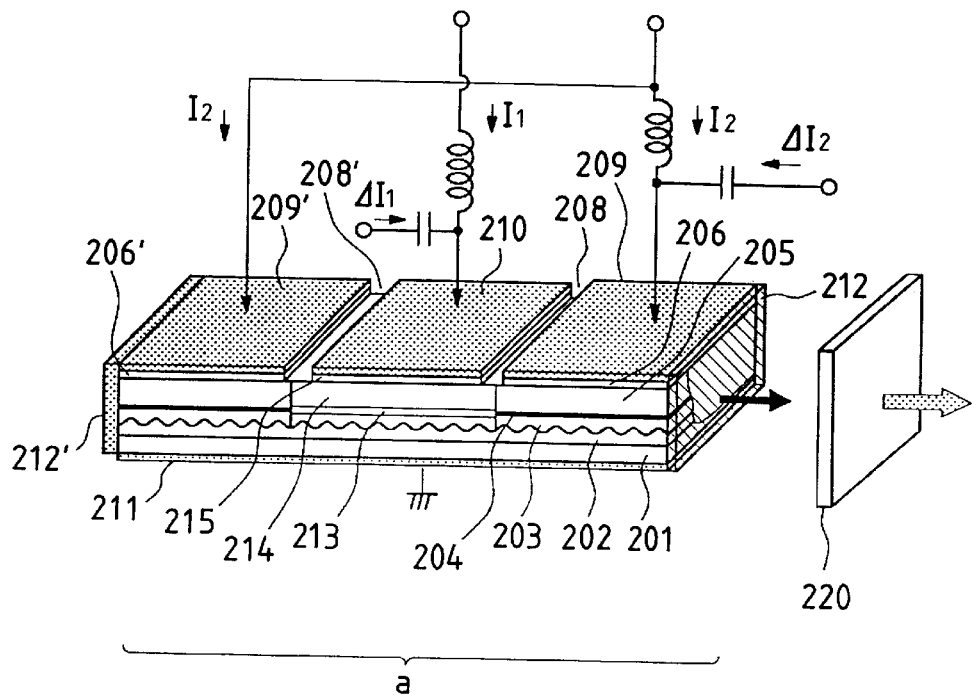
FIG. 11 is a perspective view showing a semiconductor laser used in the fourth embodiment and a portion of a driving current injecting means used in the embodiment.

The fourth embodiment of the present invention will be described below with reference to FIG. 11. FIG. 11 is a perspective view of a semiconductor DFB laser of this embodiment. Although the arrangement of layers is identical with that in the first embodiment, this laser has a three-electrode structure in which an electrode in the central portion has a phase adjustment region from which an active layer is removed. This further improves the controllability of polarization switching.

The laser includes an n-InP substrate 201, an n-InP buffer layer 202 in which a diffraction grating 0.05 $\mu$m in depth is formed, a 0.2-$\mu$m thick n-InGaAsP (band-gap wavelength $\lambda$g=1.17 $\mu$m) lower optical guide layer 203, an active layer 204 with a strained superlattice structure consisting of five 10-nm thick i-In$_{0.29}$Ga$_{0.71}$As well layers and five 10-nm thick i-InGaAsP ($\lambda$g=1.17 $\mu$m) layers, a p-InP cladding layer 205, a p-In$_{0.53}$Ga$_{0.47}$As contact layer 206, a high-resistance InP buried layer 207, electrode isolation regions 208 and 208' from which the contact layer 206 is removed, Cr/AuZnNi/Au layers 209 and 209' as electrodes, a Cr/AuZnNi/Au layer 210 as an electrode, an AuGeNi/Au layer 211 as a substrate electrode, and SiO films 212 and 212' as antireflection films.

In the central portion from which the active layer is removed, the contact layer, the cladding layer, and the active layer are etched away, and an i-InGaAsP ($\lambda$g=1.17 $\mu$m) optical guide layer 213, a p-InP cladding layer 214, and a p-In$_{0.53}$Ga$_{0.47}$As contact layer 215 are formed by selective regrowth. The grating pitch and the like are the same as in the first embodiment.

A current driving method is as follows. A DC bias current I$_2$ is flowed through the electrodes 209 and 209' on the two sides, and a DC bias I$_1$ and a modulation current $\Delta$I$_1$ are flowed through the central electrode 210. When I$_2$=60 mA and I$_1$=20 mA, it was possible to superpose a digital signal of $\Delta$I$_1$=2 mA and perform TE/TM polarization switching.

Figure 18:
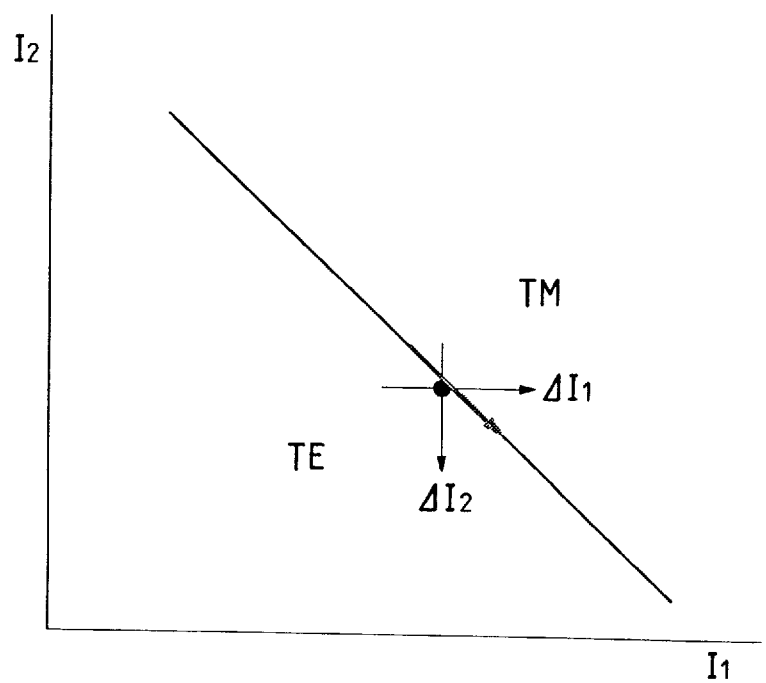
FIG. 18 is a graph showing the oscillation mode distributions of TE and TM modes of a semiconductor laser with a small thermal effect.

In the semiconductor laser of this embodiment, compared to the semiconductor layer in the first embodiment, only the phase can be controlled in the phase adjustment region of the central electrode without changing the gain, and the influence of heat is also decreased. Consequently, it was possible to predict that the distributions of TE and TM oscillation modes were as shown in FIG. 18 and the slope of the boundary line was negative. Therefore, $\Delta$I$_1$/$\Delta$I$_2$ was optimized by flowing a polarization switching characteristic compensating current $\Delta$I$_2$ having an opposite phase to that of $\Delta$I$_1$. The result was that $\Delta$I$_1$/$\Delta$I$_2$ was optimized when $\Delta$I$_1$/$\Delta$I$_2$=5. Although the method of driving $\Delta$I$_1$ and $\Delta$I$_2$ is analogous to that in the first or second embodiment, the phases of $\Delta$I$_1$ and $\Delta$I$_2$ are made opposite to each other. Accordingly, if the driver of the first embodiment is to be used, a non-inverting type amplifier is used as the operational amplifier 407 with a cutoff frequency of 1 MHz. If the driver of the second embodiment is to be used, the modulation outputs from the driver ICs 503 and 504 are so set as to have opposite phases.

In this embodiment, $\Delta$I$_1$/$\Delta$I$_2$ is optimized without obtaining actual TE and TM oscillation modes. However, as in each embodiment described above, it is also possible to obtain the boundary line between the TE and TM oscillation distributions and determine $\Delta$I$_1$/$\Delta$I$_2$ so that $\Delta$I$_1$/$\Delta$I$_2$ is parallel to the boundary line.

Also, in the above embodiments, the InP-based lasers have been described. However, the present invention can be similarly realized even by using some other material such as a GaAs-based material.

(Fifth Embodiment)

Figure 12:
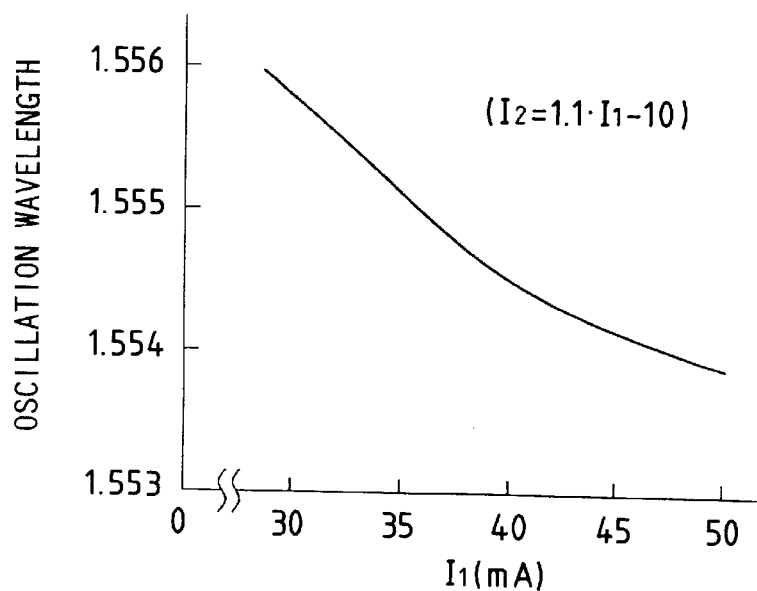
FIG. 12 is a graph showing the tuning characteristic of the semiconductor laser used in the first embodiment.

The fifth embodiment of the present invention makes use of the tunability of a laser in order to perform wavelength multiplex transmission. The oscillation wavelength of the two-electrode DFB laser of the first embodiment can be changed by controlling the values of currents to be flowed into the two electrodes. FIG. 12 shows the resultant tunability characteristic. When a current I$_1$ is changed from 30 mA to 50 mA while the boundary line between TE and TM in FIGS. 19A and 19B, i.e., the relationship of 1.1•I$_1$−I$_2$=10 mA is held constant, the oscillation wavelength can be continuously changed by approximately 2 nm from 1.556 $\mu$m to 1.554 $\mu$m.

Figure 13:
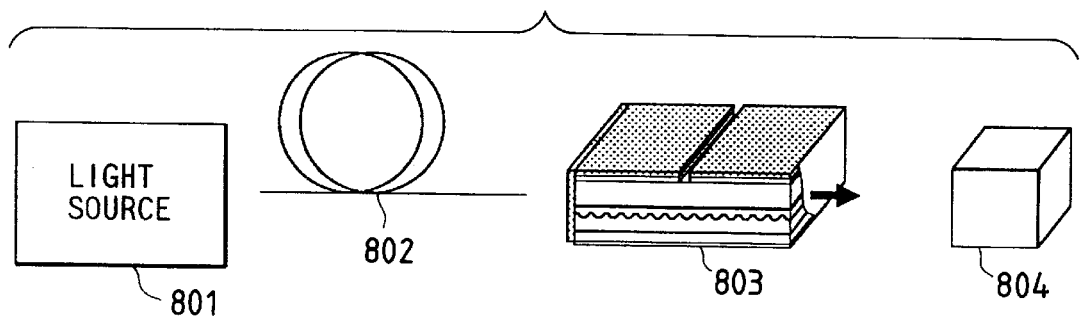
FIG. 13 is a view showing the arrangement of a transmission system when wavelength multiplex transmission is performed in the fifth embodiment.

A method of performing wavelength multiplex communication by using the driving method of the present invention will be described below with reference to FIG. 13. An optical communication light source 801 is polarization-modulated by the present invention. The wavelength of this light source can be changed in the range of 2 nm as described above. In polarization modulation, dynamic wavelength modulation called chirping, which is a problem in regular direct intensity modulation, is very small, 2 GHz or less, in obtaining an extinction ratio (about 10 dB) which is necessary for transmission. Therefore, in performing wavelength multiplexing, an interval of 10 GHz (approximately 0.05 nm) gives no crosstalk to each adjacent channel. Accordingly, when this light source is used, wavelength multiplexing of about 2/0.05=40 channels is possible.

The emitted light from this light source is coupled to a single-mode fiber 802 and transmitted to a receiver having an optical filter 803 and a photodetector 804. From the signal light transmitted through the optical fiber, the optical filter 803 selects and demultiplexes a light component having a desired wavelength, and the photodetector 804 performs signal detection. In this embodiment, the optical filter has the same structure as the DFB laser used in, e.g., the first embodiment, and the current is biased to be lower than the threshold value. As with the DFB laser, by changing the current ratio of the two electrodes, the transmission wavelength can be changed by about 2 nm while the transmission gain is held at 20 dB. The transmission width of this filter whose gain is reduced by 10 dB is about 0.03 nm, i.e., the filter has an enough characteristic to perform wavelength multiplexing at intervals of 0.05 nm as described above. As this optical filter, it is also possible to use a Mach-Zehnder filter or a fiber Fabry-Perot filter enumerated in "Related Background Art". Additionally, although the laser of this embodiment includes only one light source and one receiver, transmission can be performed by coupling several light sources or several receivers through optical couplers.

Furthermore, when a three-electrode structure such as described in the fourth embodiment is used as the DFB laser, it is possible to broaden the tuning range and thereby further increase the degree of wavelength multiplexing.

(Sixth Embodiment)

Figure 14:
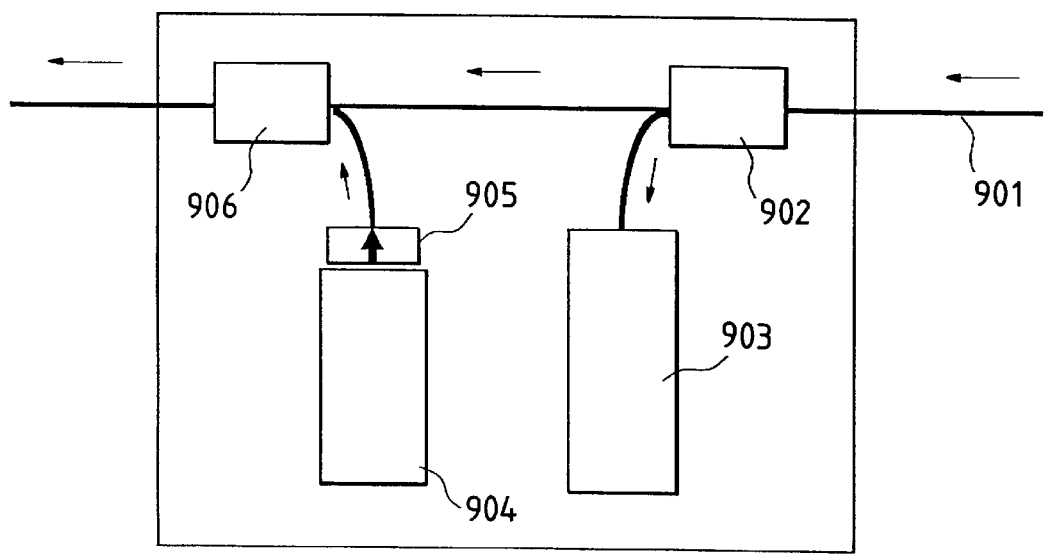
FIG. 14 is a view showing the configuration of a node in the sixth embodiment.
Figure 15:
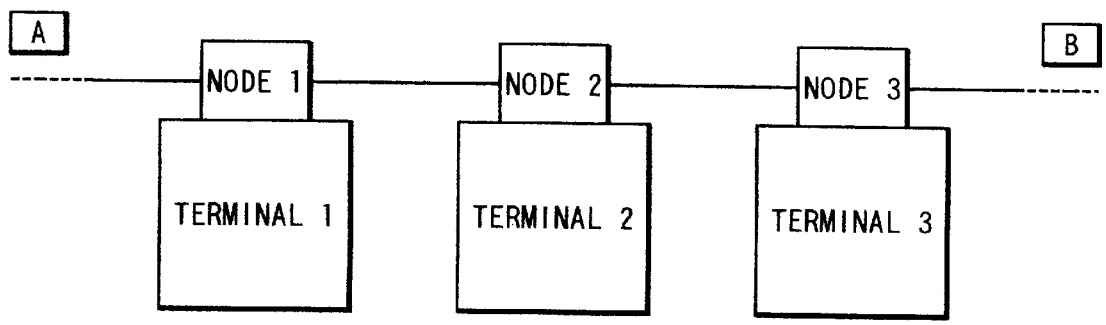
FIG. 15 is a view showing an example of the arrangement of an optical LAN.

FIG. 14 shows an example of the configuration of a photoelectric converter (node) connected to a terminal when the optical communication light source driving method of the present invention and an optical communication system using the method are applied to a wavelength multiplexing optical LAN system. FIG. 15 shows an example of the configuration of an optical LAN system using the node.

An optical signal is input to the node through an optical fiber 901 connected to individual components. A divider 902 feeds a portion of the input signal to a receiver 903 including a tunable filter such as described in the fifth embodiment. As this tunable filter, it is possible to use, e.g., a fiber Fabry-Pérot filter, a Mach-Zehnder filter, or an interference film filter. The receiver performs signal detection by extracting only an optical signal having a desired wavelength. To transmit an optical signal from the node, on the other hand, a tunable DFB laser 904 is driven to perform polarization modulation as described in the first to fourth embodiments. The intensity of the output is modulated by a polarizer and an isolator 905. The resultant light is fed into the light transmission line via the divider 906.

If the tuning range needs to be further broadened, it is only necessary to provide a plurality of tunable lasers.

The network of the optical LAN system shown in FIG. 15 is a bus-type network in which a large number of networked terminals and centers can be accommodated by connecting nodes in the directions of A and B. To connect a large number of nodes, however, an optical amplifier for compensating for an optical attenuation must be arranged in series with the transmission line. Also, bidirectional optical transmission using a DQDB method is possible when two nodes are connected to each terminal to form two transmission lines.

Furthermore, as the form of the network, it is possible to apply a loop network in which A and B in FIG. 15 are connected, a star network, or a composite form of these networks.

(Seventh Embodiment)

Figure 16:
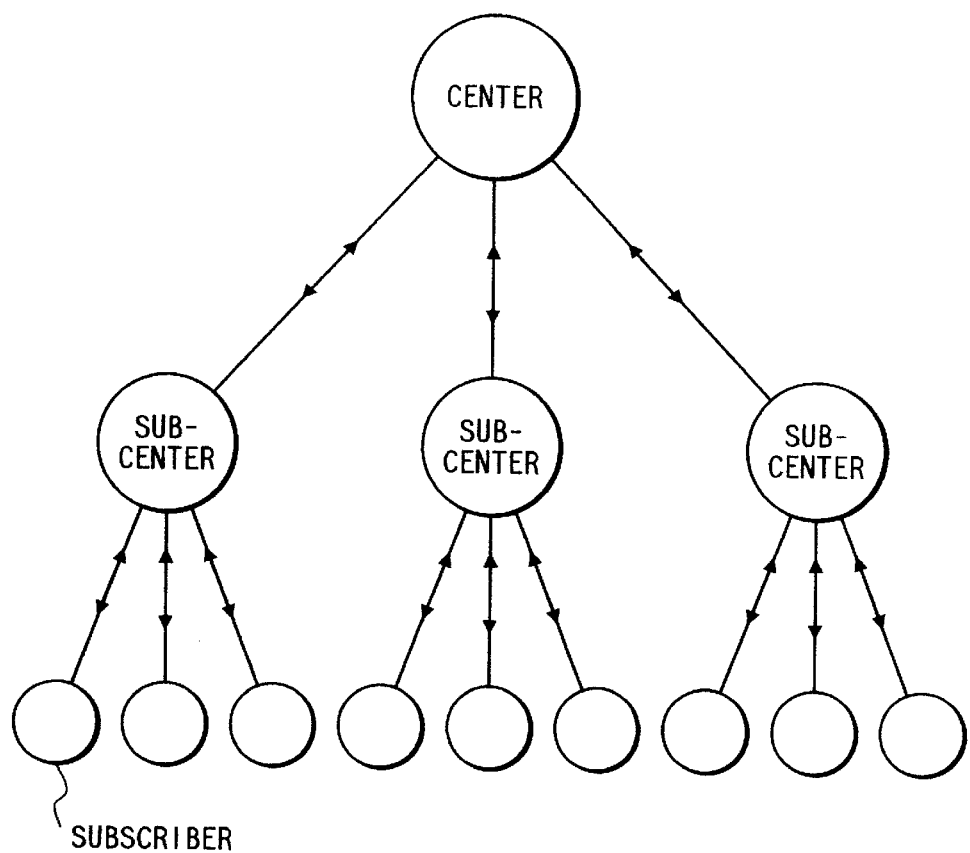
FIG. 16 is a view showing an example of the arrangement of an optical CATV system.
Figure 17:
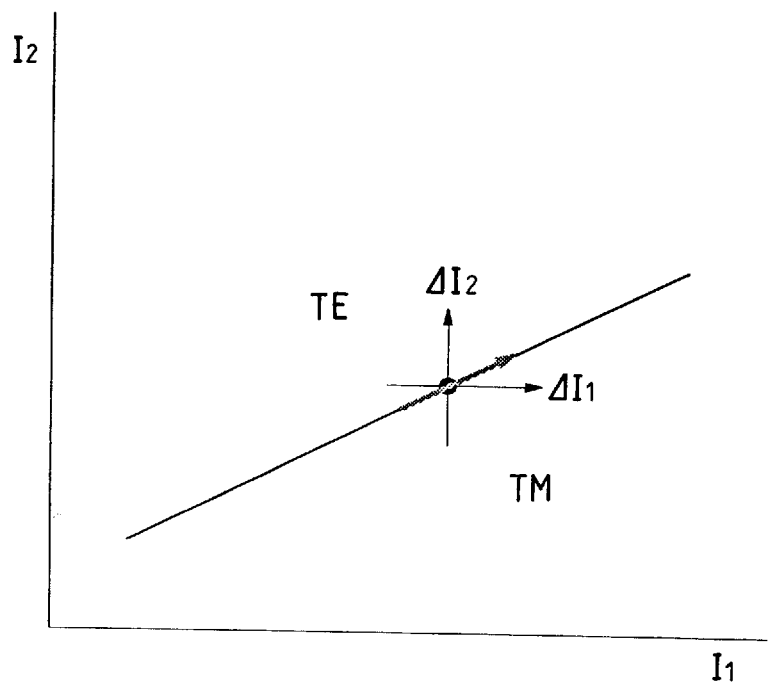
FIG. 17 is a graph showing the oscillation mode distributions of TE and TM modes of a semiconductor laser with a large thermal effect.

The present invention can construct a wavelength multiplexing CATV having a topology as illustrated in FIG. 16. In the CATV center, a tunable laser is polarization-modulated by the method of any of the first to fourth embodiments of the present invention and used as a wavelength multiplexing light source. Each subscriber as the reception side uses a receiver including the tunable filter described in the fifth embodiment. Conventionally, it is difficult to apply a DFB filter to such a system due to the influence of a dynamic wavelength variation of a DFB laser. The present invention makes this application feasible.

Furthermore, each subscriber is given an external modulator, and a signal from a given subscriber is received by reflected light from the modulator (one form of simple bidirectional optical CATV, e.g., Ishikawa and Furuta, "Bidirectional Transmission LAN External Modulator in Optical CATV Subscriber System", The Institute of Electronics, Information and Communication Engineers, Technical report of IEICE, OCS91-82, p. 51, 1991). When a star network such as shown in FIG. 16 is constructed in this way, bidirectional CATV is realized, and this improves the functions of service.

In the present invention, as has been described above, two modulation currents whose phase relationship is adjusted are injected into different electrodes of a multi-electrode semiconductor laser. Consequently, the modulation band of polarization modulation is widened particularly to low frequencies without providing the semiconductor laser with any special means. Since this improves the degree of freedom of coding, the error rate of reception is reduced even with a long continuous code, and thereby higher-density transmission is made possible. It is also possible to suitably determine the relationship between the phases of the two modulation currents and the amplitudes of the two modulation currents. Furthermore, since the cutoff frequencies and the output characteristics (e.g., the difference between an inverting output and a non-inverting output) of amplifiers used in a laser driver are used, the two modulation currents can be injected by a simple, low-cost driver. Additionally, since a voltage-current converter is used in the laser driver, the gain effect of the converter can be utilized, and the modulation band can be greatly widened to low frequencies. Moreover, in optical communication, a wavelength variation is small even when the modulation band is widened, so high-density wavelength multiplexing is possible.

What is claimed is:

1. A semiconductor laser driving method of driving a semiconductor laser having not less than two electrodes by switching two polarization modes with different planes of polarization, comprising the steps of:

injecting a main modulation current into one of said electrodes; and injecting a sub-modulation current whose phase is adjusted with respect to the main modulation current into at least one of said electrodes except for the electrode into which the main modulation current is injected.

2. A method according to claim 1, wherein the step of injecting the sub-modulation current is executed when a frequency of the switching is lower than a predetermined frequency.

3. A method according to claim 2, wherein the predetermined frequency is approximately 1 MHz.

4. A method according to claim 1, wherein the phase and a modulation amplitude of the sub-modulation current is so adjusted as to decrease a phase difference between the main modulation current and an output optical signal from said semiconductor laser.

5. A method according to claim 4, wherein a ratio of modulation amplitudes of the sub-modulation current and the main modulation current is so adjusted that a slope of a boundary line between a region in which said polarization mode has a first plane of polarization and a region in which said polarization mode has a second plane of polarization, which is determined by an orthogonal coordinate system of the sub-modulation current and the main modulation current, and on which the two polarization modes of said semiconductor laser are switched, is substantially equal to ratio of the modulation amplitudes.

6. A method according to claim 1, wherein the phase of the sub-modulation current is so adjusted as to be the same phase as or an opposite phase to a phase of the main modulation current.

7. A method according to claim 6, wherein whether the phase of the sub-modulation current is to be the same phase as or an opposite phase to the phase of the main modulation current is determined in accordance with whether a sign of a slope of a boundary line between a region in which said polarization mode has a first plane of polarization and a region in which said polarization mode has a second plane of polarization, which is determined by an orthogonal coordinate system of the sub-modulation current and the main modulation current, and on which the two polarization modes of said semiconductor laser are switched, is positive or negative.

8. A method according to claim 1, wherein the phase of the sub-modulation current is so adjusted as to decrease a phase difference between the main modulation current and an output optical signal from said semiconductor laser.

9. An optical communication method in an optical communication system which transmits information in the form of an optical signal between nodes, comprising the steps of:

switching two polarization modes of an output from a semiconductor laser having a plurality of electrodes in accordance with information to be transmitted in a node for transmitting information;

outputting light having one of the two polarization modes to an optical transmission line; and receiving the optical signal on said optical transmission line in a node for receiving information, wherein the step of switching the two polarization modes comprises the substeps of:

injecting a main modulation current corresponding to the information to be transmitted into one of said electrodes; and injecting a sub-modulation current whose phase is adjusted with respect to the main modulation current into at least one of said electrodes except for the electrode into which the main modulation current is injected.

10. A method according to claim 9, wherein output optical signals from a plurality of nodes for simultaneously transmitting information in said optical communication system have different wavelengths.

11. A semiconductor laser device for outputting two polarization modes with different planes of polarization by switching the two polarization modes, comprising:

a semiconductor laser having not less than two electrodes;

means for injecting a main modulation current into one of said electrodes of said semiconductor laser; and means for injecting a sub-modulation current whose phase is adjusted with respect to the main modulation current into at least one of said electrodes except for the electrode into which the main modulation current is injected.

12. A device according to claim 11, wherein the sub-modulation current is injected when a frequency of the switching is lower than a predetermined frequency.

13. A device according to claim 12, wherein the predetermined frequency is approximately 1 MHz.

14. A device according to claim 11, further comprising:

a modulation power supply; and means for supplying in output from said modulation power supply to said means for injecting the main modulation current and said means for injecting the sub-modulation current.

15. A device according to claim 14, wherein said means for injecting the sub-modulation current has a frequency characteristic and does not inject the sub-modulation current if a frequency of the output from said modulation power supply exceeds a predetermined frequency.

16. A device according to claim 15, wherein the predetermined frequency is approximately 1 MHz.

17. A device according to claim 11, wherein said semiconductor laser is a distributed feedback laser including a diffraction grating near an optical waveguide containing a light-emitting layer, so that said light-emitting layer contains a quantum well structure, and a wavelength corresponding to an energy band gap between an energy level of a light hole and a ground level of an electron in a quantum well of said quantum well structure is close to a Bragg wavelength of said diffraction grating.

18. A device according to claim 17, wherein threshold gains at the Bragg wavelength in the two polarization modes are substantially equal.

19. A device according to claim 17, wherein said quantum well structure is a strained quantum well structure into which a strain is introduced, so that in a quantum well an energy level of a light hole and an energy level of a heavy hole are equal or the energy level of a light hole is closer to a ground level of an electron.

20. A device according to claim 19, wherein the strain is a tensile strain introduced into an internal quantum well of said quantum well structure.

21. A device according to claim 17, wherein said quantum well structure is a multiple quantum well structure.

22. A semiconductor laser device for outputting two polarization modes with different planes of polarization by switching the polarization modes, comprising:

a semiconductor laser having not less than two electrodes;

a modulation power supply;

first injecting means for passing an output from said modulation power supply through a first amplifier and injecting the output as a first modulation current into one of said electrodes of said semiconductor laser; and second injecting means for passing the output from said modulation power supply through a second amplifier and injecting the output as a second modulation current into at least one of said electrodes except for the electrode into which said first injecting means injects the first modulation current, wherein a cutoff frequency of said second amplifier is a predetermined frequency, and the second modulation current is not injected if a frequency of the output from said modulation power supply exceeds the predetermined frequency.

23. A device according to claim 22, wherein the outputs from said first and second amplifiers have the same phase.

24. A device according to claim 22, wherein the outputs from said first and second amplifiers have opposite phases.

25. A device according to claim 22, wherein the predetermined frequency is approximately 1 MHz.

26. A device according to claim 22, wherein a ratio of gains of said first and second amplifiers is so adjusted as to decrease a difference between a phase of the main modulation current and a phase of an output optical signal from said semiconductor laser.

27. A semiconductor laser device for outputting two polarization modes with different planes of polarization by switching the polarization modes, comprising:

a semiconductor laser having not less than two electrodes;

a modulation power supply;

first injecting means for passing an output from said modulation power supply through a first voltage-current converter, DC-coupling an output from said first voltage-current converter and a first DC current, and injecting the resultant current as a first modulation current into one of said electrodes of said semiconductor laser; and second injecting means for passing the output from said modulation power supply through a second voltage-current converter, DC-coupling an output from said second voltage-current converter and a second DC current, and injecting the resultant current as a second modulation current into at least one of said electrodes except for the electrode into which said first injecting means injects the first modulation current, wherein said second injecting means has a low-pass filter with a predetermined cutoff frequency for filtering the output from said second voltage-current converter, and the second modulation current is not injected if a frequency of the output from said modulation power supply exceeds the predetermined frequency.

28. A device according to claim 27, wherein said first and second voltage-current converters DC-couple the output from said modulation power supply at the same phase.

29. A device according to claim 27, wherein said first and second voltage-current converters DC-couple the output from said modulation power supply at opposite phases.

30. A device according to claim 27, wherein the predetermined frequency is approximately 1 MHz.

31. A device according to claim 27, wherein a ratio of gains of said first and second voltage-current converters is so adjusted as to decrease a difference between a phase of the main modulation current and a phase of an output optical signal from said semiconductor laser.

32. A node used in an optical communication system for transmitting information in the form of an optical signal between nodes, comprising:

a semiconductor laser device for outputting two polarization modes with different planes of polarization by switching the polarization modes in accordance with information to be transmitted; and polarization mode selecting means for selectively outputting one of the two polarization modes of the output from said semiconductor laser device;

wherein said semiconductor laser device comprises:

a semiconductor laser having not less than two electrodes;

means for injecting a main modulation current corresponding to the information to be transmitted into one of said electrodes of said semiconductor laser; and means for injecting a sub-modulation current whose phase is adjusted with respect to the main modulation current into at least one of said electrodes except for the electrode into which the main modulation current is injected.

33. A node according to claim 32, wherein the sub-modulation current is injected when a frequency of the switching is lower than a predetermined frequency.

34. A node according to claim 33, wherein the predetermined frequency is approximately 1 MHz.

35. A node according to claim 32, wherein said semiconductor laser device further comprises:

a modulation power supply; and means for supplying an output from said modulation power supply to said means for injecting the main modulation current and said means for injecting the sub-modulation current.

36. A node according to claim 35, wherein said means for injecting the sub-modulation current has a frequency characteristic and does not inject the sub-modulation current if a frequency of the output from said modulation power supply exceeds a predetermined frequency.

37. A node according to claim 36, wherein the predetermined frequency is approximately 1 MHz.

38. A node according to claim 32, wherein said semiconductor laser is a distributed feedback laser including a diffraction grating near an optical waveguide containing a light-emitting layer, so that said light-emitting layer contains a quantum well structure, and a wavelength corresponding to an energy band gap between an energy level of a light hole and a ground level of an electron in a quantum well of said quantum well structure is close to a Bragg wavelength of said diffraction grating.

39. A node according to claim 38, wherein threshold gains at the Bragg wavelength in the two polarization modes are substantially equal.

40. A node according to claim 38, wherein said quantum well structure is a strained quantum well structure into which a strain is introduced, so that in a quantum well an energy level of a light hole and an energy level of a heavy hole are equal or the energy level of a light hole is closer to a ground level of an electron.

41. A node according to claim 40, wherein the strain is a tensile strain introduced into an internal quantum well of said quantum well structure.

42. A node according to claim 38, wherein said quantum well structure is a multiple quantum well structure.

43. An optical communication system for transmitting information in the form of an optical signal between nodes, comprising:

a node for transmitting information, comprising:

a semiconductor laser device for outputting two polarization modes with different planes of polarization by switching the polarization modes in accordance with information to be transmitted; and polarization mode selecting means for selectively outputting one of the two polarization modes of the output from said semiconductor laser device, wherein said semiconductor laser device comprises:

a semiconductor laser having not less than two electrodes;

means for injecting a main modulation current corresponding to the information to be transmitted into one of said electrodes of said semiconductor laser; and means for injecting a sub-modulation current whose phase is adjusted with respect to the main modulation current into at least one of said electrodes except for the electrode into which the main modulation current is injected; and a node for receiving information comprising:

means for demodulating an intensity of an optical signal transmitted from said node for transmitting information.

44. A system according to claim 43, wherein the sub-modulation current is injected when a frequency of the switching is lower than a predetermined frequency.

45. A system according to claim 44, wherein the predetermined frequency is approximately 1 MHz.

46. A system according to claim 43, wherein said semiconductor laser device further comprises:

a modulation power supply; and means for supplying an output from said modulation power supply to said means for injecting the main modulation current and said means for injecting the sub-modulation current.

47. A system according to claim 46, wherein said means for injecting the sub-modulation current has a frequency characteristic and does not inject the sub-modulation current if a frequency of the output from said modulation power supply exceeds a predetermined frequency.

48. A system according to claim 47, wherein the predetermined frequency is approximately 1 MHz.

49. A system according to claim 43, wherein said semiconductor laser is a distributed feedback laser including a diffraction grating near an optical waveguide containing a light-emitting layer, so that said light-emitting layer contains a quantum well structure, and a wavelength corresponding to an energy band gap between an energy level of a light hole and a ground level of an electron in a quantum well of said quantum well structure is close to a Bragg wavelength of said diffraction grating.

50. A system according to claim 49, wherein threshold gains at the Bragg wavelength in the two polarization modes are substantially equal.

51. A system according to claim 49, wherein said quantum well structure is a strained quantum well structure into which a strain is introduced, so that in a quantum well an energy level of a light hole and an energy level of a heavy hole are equal or the energy level of a light hole is closer to a ground level of an electron.

52. A system according to claim 51, wherein the strain is a tensile strain introduced into an internal quantum well of said quantum well structure.

53. A system according to claim 49, wherein said quantum well structure is a multiple quantum well structure.

54. A semiconductor laser device for outputting a light modulated between two polarization modes with different planes of polarization, comprising a semiconductor laser having a first electrode into which a main modulation current is injected and a second electrode into which a sub-modulation current, whose phase is adjusted with respect to the main modulation current, is injected.

55. A device according to claim 54, wherein the sub-modulation current is injected when a frequency of the modulation is lower than a predetermined frequency.

56. A device according to claim 55, wherein the predetermined frequency is approximately 1 MHz.

57. A device according to claim 54, further comprising:
   a modulation power supply; and
   a circuit connecting said modulation power supply to said electrodes.

58. A device according to claim 57, wherein said circuit has a frequency characteristic and does not supply the sub-modulation current if a frequency of an output from said modulation power supply exceeds a predetermined frequency.

59. A device according to claim 54, wherein said semiconductor laser is a distributed feedback laser including a diffraction grating near an optical waveguide containing a light-emitting layer, so that said light-emitting layer contains a quantum well structure, and wherein a wavelength corresponding to an energy band gap between an energy level of a light hole and a ground level of an electron in a quantum well of said quantum well structure is close to a Bragg wavelength of said diffraction grating.

60. A device according to claim 59, wherein threshold gains at the Bragg wavelength in the two polarization modes are substantially equal.

61. A device according to claim 59, wherein said quantum well structure is a strained quantum well structure into which a strain is introduced, so that in a quantum well an energy level of a light hole and an energy level of a heavy hole are equal or the energy level of a light hole is closer to a ground level of an electron.

62. A device according to claim 61, wherein the strain is a tensile strain introduced into an internal quantum well of said quantum well structure.

63. A device according to claim 59, wherein said quantum well structure is a multiple quantum well structure.

64. A device according to claim 54, wherein the phase and/or a modulation amplitude of the sub-modulation current is so adjusted as to decrease a phase difference between the main modulation current and an output signal from said semiconductor laser.

65. A device according to claim 54, wherein the phase of the sub-modulation current is so adjusted as to be the same phase as or an opposite phase to a phase of the main modulation current.

66. A device according to claim 65, wherein a determination is made as to whether the phase of the sub-modulation current is to be the same phase as or an opposite phase to the phase of the main modulation current, in accordance with whether the algebraic sign of a slope of a boundary line, which is determined by an orthogonal coordinate system of the sub-modulation current and the main modulation current, and on which the two polarization modes of said semiconductor laser are switched.

67. A device according to claim 65, wherein a ratio of modulation amplitudes of the sub-modulation current and the main modulation current is so adjusted that a slope of a boundary line which is determined by an orthogonal coordinate system of the sub-modulation current and the main modulation current, and on which the two polarization modes of said semiconductor laser are switched, is substantially parallel to a synthetic amplitude of the sub-modulation current and the main modulation current in the orthogonal coordinate system.

68. A device according to claim 54, wherein the phase of the sub-modulation current is so adjusted as to decrease a phase difference between the main modulation current and an output optical signal from said semiconductor laser.

69. A semiconductor laser device for outputting a light modulated between two polarization modes with different planes of polarization, comprising a semiconductor laser having first and second electrodes and a current injector which injects a main modulation current into said first electrode and which injects a sub-modulation current, whose phase is adjusted with respect to the main modulation current, into said second electrode.

70. A device according to claim 69, wherein the sub-modulation current is injected when a frequency of the modulation is lower than a predetermined frequency.

71. A device according to claim 70, wherein the predetermined frequency is approximately 1 MHz.

72. A device according to claim 69, further comprising:
   a modulation power supply; and
   a circuit connecting said modulation power supply to said electrodes.

73. A device according to claim 72, wherein said circuit has a frequency characteristic and does not supply the sub-modulation current if a frequency of an output from said modulation power supply exceeds a predetermined frequency.

74. A device according to claim 59, wherein said semiconductor laser is a distributed feedback laser including a diffraction grating near an optical waveguide containing a light-emitting layer, so that said light-emitting layer contains a quantum well structure, and wherein a wavelength corresponding to an energy band gap between an energy level of a light hole and a ground level of an electron in a quantum well of said quantum well structure is close to a Bragg wavelength of said diffraction grating.

75. A device according to claim 74, wherein threshold gains at the Bragg wavelength in the two polarization modes are substantially equal.

76. A device according to claim 74, wherein said quantum well structure is a strained quantum well structure into which a strain is introduced, so that in a quantum well an energy level of a light hole and an energy level of a heavy hole are equal or the energy level of a light hole is closer to a ground level of an electron.

77. A device according to claim 76, wherein the strain is a tensile strain introduced into an internal quantum well of said quantum well structure.

78. A device according to claim 74, wherein said quantum well structure is a multiple quantum well structure.

79. A device according to claim 69, wherein the phase and/or a modulation amplitude of the sub-modulation current is so adjusted as to decrease a phase difference between the main modulation current and an output signal from said semiconductor laser.

80. A device according to claim 69, wherein the phase of the sub-modulation current is so adjusted as to be the same phase as or an opposite phase to a phase of the main modulation current.

81. A device according to claim 80, wherein a determination is made as to whether the phase of the sub-modulation current is to be the same phase as or an opposite phase to the phase of the main modulation current, in accordance with whether the algebraic sign of a slope of a boundary line, which is determined by an orthogonal coordinate system of the sub-modulation current and the main modulation current, and on which the two polarization modes of said semiconductor laser are switched.

82. A device according to claim 81, wherein a ratio of modulation amplitudes of the sub-modulation current and the main Modulation current is so adjusted that a slope of a boundary line which is determined by an orthogonal coordinate system of the sub-modulation current and the main modulation current, and on which the two polarization modes of said semiconductor laser are switched, is substantially parallel to a synthetic amplitude of the sub-modulation current and the main modulation current in the orthogonal coordinate system.

83. A device according to claim 69, wherein the phase of the sub-modulation current is so adjusted as to decrease a phase difference between the main modulation current and an output optical signal from said semiconductor laser.

* * * * *

UNITED STATES PATENT AND TRADEMARK OFFICE
CERTIFICATE OF CORRECTION

PATENT NO. : 5,850,408
DATED     : December 15, 1998
INVENTOR(S): TOSHIHIKO OUCHI ET AL.

Page 1 of 2

It is certified that error appears in the above-identified patent and that said Letters Patent is hereby corrected as shown below:

ON THE COVER PAGE AT [56] OTHER PUBLICATIONS

After M. Suzuki, et al.,:

"No. 8," should read --No. 78,--.
"pp. 9-105" should read --pp. 99-105--.

COLUMN 1

Line 14, "particular," should read --particularly,--.

COLUMN 2

Line 66, "the" should read --in the--.

COLUMN 5

Line 44, "change" should read --changes--.

UNITED STATES PATENT AND TRADEMARK OFFICE
CERTIFICATE OF CORRECTION

PATENT NO. : 5,850,408
DATED : December 15, 1998
INVENTOR(S): TOSHIHIKO OUCHI ET AL.

It is certified that error appears in the above-identified patent and that said Letters Patent is hereby corrected as shown below:

COLUMN 12

Line 32, "an enough" should read --enough--.

COLUMN 15

Line 24, "in" should read --an--.

COLUMN 20

Line 34, "claim 59," should read --claim 69,--.

COLUMN 21

Line 10, "Modulation" should read --modulation--.

Signed and Sealed this

Twelfth Day of October, 1999

Q. TODD DICKINSON

Attest:

Attesting Officer

Acting Commissioner of Patents and Trademarks